United States Patent
Brandl et al.

(10) Patent No.: US 12,322,434 B2
(45) Date of Patent: Jun. 3, 2025

(54) DIRECTED REFRESH MANAGEMENT FOR DRAM

(71) Applicant: Advanced Micro Devices, Inc., Santa Clara, CA (US)

(72) Inventors: Kevin M. Brandl, Austin, TX (US); James R. Magro, Lakeway, TX (US); Kedarnath Balakrishnan, Bangalore (IN); Jing Wang, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 195 days.

(21) Appl. No.: 17/957,820

(22) Filed: Sep. 30, 2022

(65) Prior Publication Data

US 2024/0112722 A1 Apr. 4, 2024

(51) Int. Cl.
  *G11C 11/4078* (2006.01)
  *G11C 11/406* (2006.01)

(52) U.S. Cl.
  CPC .... *G11C 11/4078* (2013.01); *G11C 11/40615* (2013.01); *G11C 11/40622* (2013.01)

(58) Field of Classification Search
  CPC ......................................... G11C 11/401–4099
  See application file for complete search history.

(56) References Cited

U.S. PATENT DOCUMENTS

| | | | |
|---|---|---|---|
| 9,281,046 B2 | 3/2016 | Brandl | |
| 9,293,188 B2 | 3/2016 | Brandl | |
| 11,222,685 B2 | 1/2022 | Brandl et al. | |
| 2017/0117030 A1 | 4/2017 | Fisch et al. | |
| 2019/0066759 A1 | 2/2019 | Nale | |
| 2019/0228813 A1* | 7/2019 | Nale | G06F 3/0659 |
| 2021/0065775 A1 | 3/2021 | Hush et al. | |
| 2022/0091784 A1 | 3/2022 | Brandl | |
| 2022/0262428 A1 | 8/2022 | Bains et al. | |
| 2022/0293162 A1 | 9/2022 | Nale | |

OTHER PUBLICATIONS

International Search Report and Written Opinion for International Application No. PCT/US2023/033587, mailed Jan. 18, 2024, 7 pages.

* cited by examiner

*Primary Examiner* — Alfredo Bermudez Lozada
(74) *Attorney, Agent, or Firm* — Polansky & Associates, P.L.L.C.; Paul J. Polansky (57) ABSTRACT

A memory controller for generating accesses for a memory includes a row hammer logic circuit for providing a sample request. In response to the sample request, the memory controller generates a sample command for dispatch to the memory to cause the memory to capture a current row. In response to a completion of the sample command, the memory controller generates a mitigation command for dispatch to the memory.

19 Claims, 5 Drawing Sheets

DIRECTED REFRESH MANAGEMENT FOR DRAM

BACKGROUND

Computer systems typically use inexpensive and high-density dynamic random-access memory (DRAM) chips for main memory. When a particular row in a DRAM chip is activated for reading or writing, the word line associated with the row is activated, and the contents of the memory cells along the row are read into a page buffer. Subsequent read and write accesses to memory cells in the row can take place wholly within the page buffer, without accessing the row again. When a data processor later accesses another row in the same memory bank, the memory cells along the row are restored in a precharge operation before the other row can be activated.

Modern DRAM chips typically store many gigabits (Gb) of data using deep sub-micron technology. Because of the high density and small feature size, rows of the memory are so physically close to other rows that the activation of a particular row can upset data stored in adjacent rows by changing the charge on the memory cell capacitors. Occasionally some memory access patterns cause certain rows to be activated and precharged so many times before the next refresh cycle that the memory cells in adjacent rows become corrupted and reverse logic state. After being corrupted, the original data is lost and cannot be restored in subsequent refresh cycles. As feature sizes become smaller, this problem, known as "row hammer", becomes harder to mitigate because the number of row activates required to cause the problem becomes smaller.

One known technique to address the data upset problem is known as targeted row refresh (TRR). In order to ensure that a DRAM row is not activated too many times within a refresh period, a memory controller places the DRAM into a TRR mode by setting certain mode register bits. In the TRR mode, the memory controller sends successive activate and precharge commands to the target row as well as the two physically adjacent rows. Once TRR mode is enabled, no other mode register commands are allowed until the TRR mode is completed. TRR mode is self-clearing and the mode register bit is set after the completion of TRR mode. While TRR allows the memory controller to avoid excessive activates to a certain row within a certain time period, it is entered by setting the mode register, which requires a substantial amount of time since all banks must be in the idle state before the controller can issue a Mode Register Set command. In addition, memory devices commonly scramble the physical locations of consecutive addresses, making it difficult or impossible for the memory controller even to know the addresses of victim rows.

Another technique is known as refresh management (RFM). When the activate instruction rate known as the rolling accumulated average (RAA) exceeds a threshold for a bank of the memory, the memory controller can send an RFM command for the bank to cause the memory to perform a mitigation based on the memory's sampling of the prior command stream. However, the RFM technique complicates the design of the memory by requiring it to track accesses internally, as well as to determine the aggressor row's victim rows.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller for generating accesses for a memory includes a row hammer logic circuit for providing a sample request. In response to the sample request, the memory controller generates a sample command for dispatch to the memory to cause the memory to capture a current row. In response to a completion of the sample command, the memory controller generates a mitigation command for dispatch to the memory.

A data processing system includes a data processor and a memory. The data processor includes at least one memory accessing agent and a memory controller for generating accesses for a memory in response to memory access requests from the at least one memory accessing agent. The memory controller includes a row hammer logic circuit for providing a sample request. In response to the sample request, the memory controller generates a sample command for dispatch to the memory to cause the memory to capture a current row. In response to a completion of the sample command, the memory controller generates a mitigation command for dispatch to the memory. The memory is coupled to the memory controller and is responsive to the sample command to store a current row, and is responsive to the mitigation command to activate and then precharge the current row and at least one physically adjacent row.

A method for directed refresh management (DRFM) for a memory that is susceptible to row hammer failures, includes detecting a row hammer event in a memory controller. A sample request is provided to the memory in response to detecting the row hammer event. A current row is sampled in the memory. A mitigation command is provided to the memory in response to providing the sample request. The row hammer event is mitigated by the memory.

Figure 1:
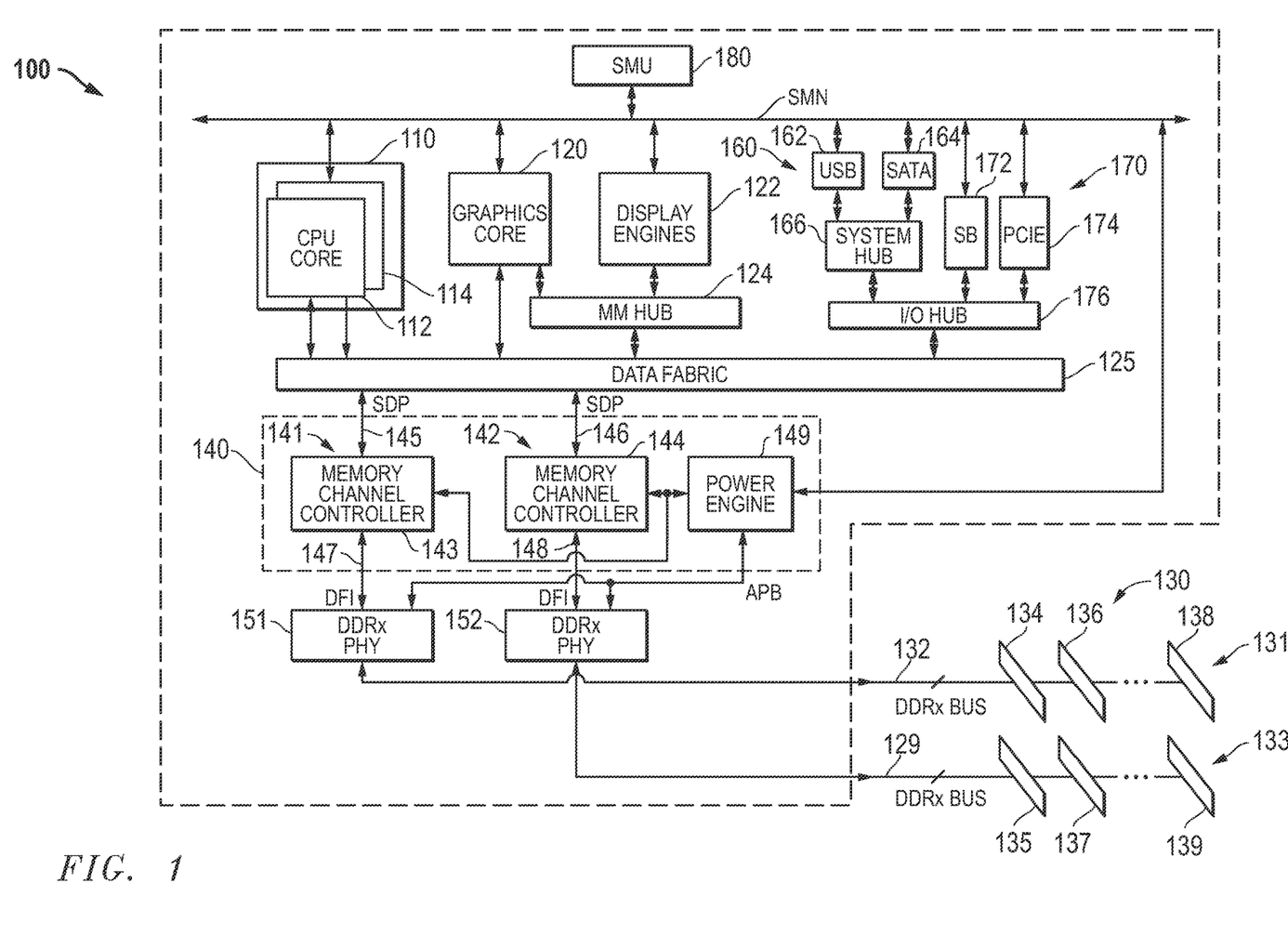
FIG. 1 illustrates in block diagram form an accelerated processing unit (APU) and memory system having a memory controller that implements directed refresh management according to some embodiments.

FIG. 1 illustrates in block diagram form an accelerated processing unit (APU) 100 and a memory system 130 known in the prior art. APU 100 is an integrated circuit suitable for use as a processor in a host data processing system. APU 100 includes generally a central processing unit (CPU) core complex 110, a graphics core 120, a set of display engines 122, a memory management hub 124, a data fabric 125, a set of peripheral controllers 160, a set of peripheral bus controllers 170, and a system management unit (SMU) 180.

CPU core complex 110 includes a CPU core 112 and a CPU core 114. In this example, CPU core complex 110 includes two CPU cores, but in other embodiments, CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high-performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are each bidirectionally connected to memory management hub 124 for uniform translation into appropriate addresses in memory system 130, and memory controller 140 is bidirectionally connected to data fabric 125 for generating such memory accesses and receiving read data returned from the memory system.

Data fabric 125 includes a crossbar switch for routing memory access requests and memory responses between any memory accessing agent and memory controller 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus, for example, a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory controller 140 and its associated physical interfaces (PHYs) 151 and 152 are integrated with APU 100 in this embodiment. Memory controller 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over the APB, and is also bidirectionally connected to memory channel controllers 143 and 144. PHY 151 has a bidirectional connection to memory channel 131. PHY 152 has a bidirectional connection to memory channel 133.

Memory controller 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a DDRx bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. One system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

As will be explained below, memory controller 140 includes features to alleviate the "row-hammer" problem including a new feature known as "directed refresh management", or DRFM. DRFM requires the memory to have only a small number of hooks to facilitate the association of an aggressor row with one or more victim rows, and to perform DRFM operations in ways that greatly reduce the impact on system performance of row hammer mitigation.

Figure 2:
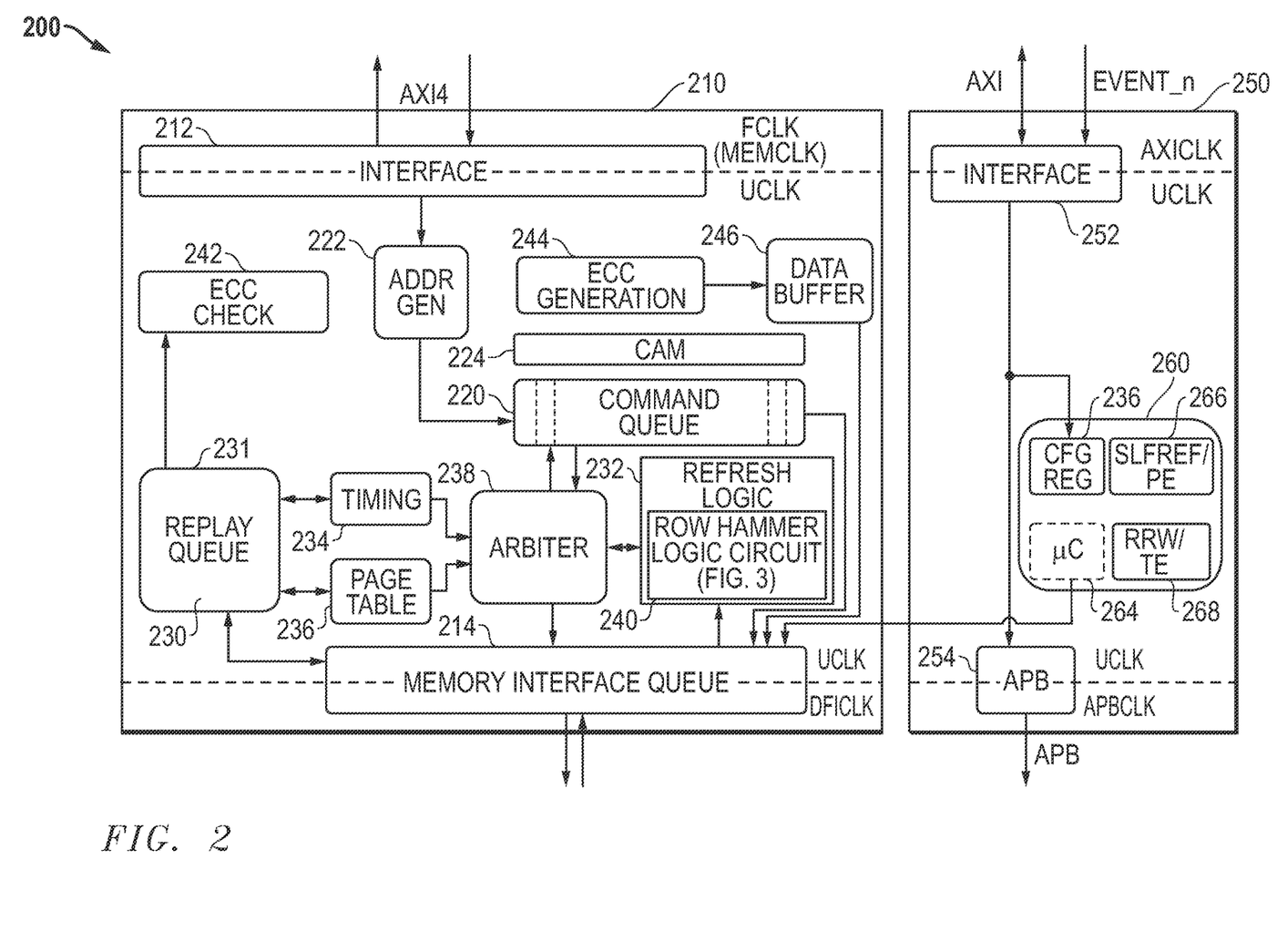
FIG. 2 illustrates in block diagram form a memory controller suitable for use as the memory controller of FIG. 1 according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231 including a replay queue 230, refresh logic 232, a timing block 234, a page table 236, an arbiter 238, an error correction code (ECC) check circuit 242, an ECC generation block 244, and a data buffer 246.

Interface 212 has a first bidirectional connection to data fabric 125 over an external bus, and has an output. In various embodiments of memory controller 200, this external bus is compatible with any of a number of types of extensible interfaces. Interface 212 translates memory access requests from a first clock domain known as the FCLK (data fabric clock) or MEMCLK (memory clock) domain to a second clock domain internal to memory controller 200 known as the UCLK (unified memory controller) domain. Similarly, memory interface queue 214 provides memory accesses from the UCLK domain to a DFICLK domain associated with the DFI interface.

Address generator 222 decodes addresses of memory access requests received from data fabric 125 over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules.

Error correction code (ECC) generation block 244 is a circuit that determines the ECC of write data to be sent to the memory. ECC check circuit 242 checks the received ECC against the incoming ECC.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a recovery sequence in which accesses are replayed in the case of a parity or ECC error of one of these cycles. Replayed commands are placed in the memory interface queue 214.

Refresh logic 232 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh logic 232 generates refresh commands periodically and in response to designated conditions to prevent data errors caused by the leaking of charge off storage capacitors of memory cells in DRAM chips. The memory regions are memory banks in some embodiments, and memory sub-banks in other embodiments as further discussed below. Refresh logic 232 also generates refresh commands, which include both refresh (REF) commands and refresh management (RFM) commands, in which the RFM commands direct the memory to perform refresh functions for mitigating row hammer issues as further described below. In addition, refresh logic 232 periodically calibrates ZQ to prevent mismatch in on-die termination resistance due to thermal changes in the system. As will be explained further below, refresh logic 232 includes a row hammer logic circuit 240 that memory controller 200 uses to implement a new mode known as "directed refresh management" (DRFM) mode. DRFM addresses the row hammer problem by dividing the functions between the memory controller and the system in a way that is efficient in terms of both performance and integrated circuit size.

Arbiter 238 is bidirectionally connected to command queue 220 and is the heart of memory channel controller 210. Arbiter 238 improves efficiency by intelligent scheduling of accesses to improve the usage of the memory bus. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "$t_{RC}$." Timing block 234 is a circuit that maintains a set of counters that determine eligibility based on this and other timing parameters specified in the JEDEC specification. Timing block 234 is bidirectionally connected to replay queue 230. Page table 236 maintains state information about active pages in each bank and rank of the memory channel for arbiter 238, and is bidirectionally connected to replay queue 230. Arbiter 238 includes an activate counter 248, which in this embodiment includes a counter for each memory region which counts a rolling number of activate commands sent over the memory channel to a memory region. To provide a rolling count, each activate command is counted, but the counter is reduced as described below when refresh commands or refresh management commands are issued for the memory region. Arbiter 238 is bidirectionally connected to refresh logic 232 to monitor refresh commands and direct refresh activities.

In response to write memory access requests received from interface 212, ECC generation block 244 is a circuit that computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Power controller 250 generally includes an interface 252 to an advanced extensible interface, version one (AXI), an advanced peripheral bus (APB) interface 254, and a power engine 260. Interface 252 has a first bidirectional connection to the SMN, which includes an input for receiving an event signal labeled "EVENT_n" shown separately in FIG. 2, and an output. APB interface 254 has an input connected to the output of interface 252, and an output for connection to a PHY over an APB. Power engine 260 has an input connected to the output of interface 252, and an output connected to an input of memory interface queue 214. Power engine 260 includes a set of configuration registers 262, a microcontroller (μC) 264, a self-refresh controller 266 labelled "SELFREF/PE", and a reliable read/write timing engine 268 labelled "RRW/TE". Configuration registers 262 are programmed over the AXI bus, and store configuration information to control the operation of various circuit blocks in memory controller 200. Accordingly, configuration registers 262 have outputs connected to these circuit blocks that are not shown in detail in FIG. 2. Self-refresh controller 266 is an engine that allows the manual generation of refreshes in addition to the automatic generation of refreshes by refresh logic 232. Reliable read/write timing engine 268 provides a continuous memory access stream to memory or I/O devices for such purposes as DDR interface maximum read latency (MRL) training and loopback testing.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular, during normal operation, arbiter 238 normally keeps pages open in different banks until they are required to be precharged prior to selecting a different page. Arbiter 238, in some embodiments, determines eligibility for command selection based on at least on respective values of activate counter 248 for target memory regions of the respective commands.

Figure 3:
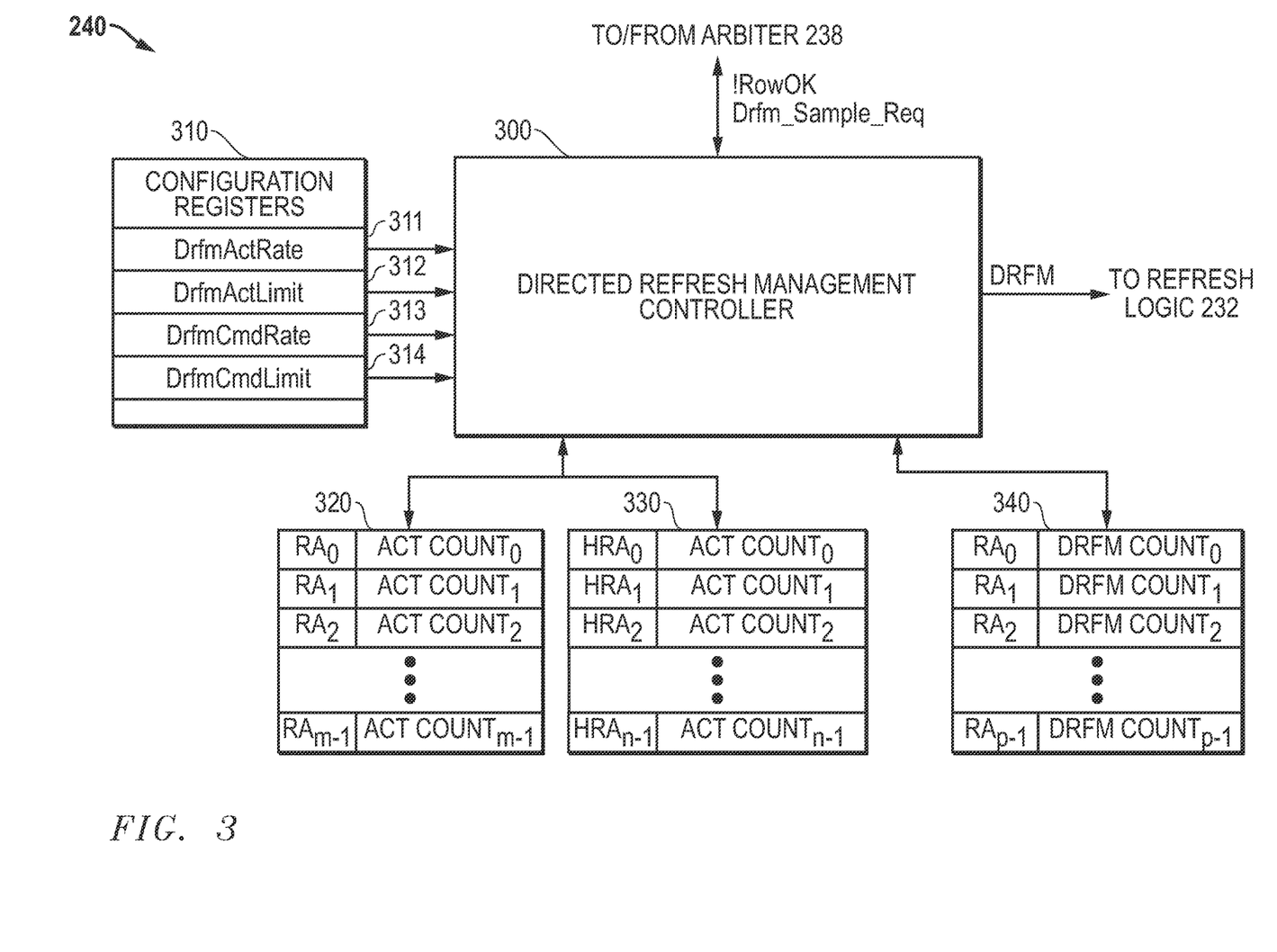
FIG. 3 illustrates in block diagram form the row hammer logic circuit of FIG. 2 according to some embodiments.

FIG. 3 illustrates in block diagram form row hammer logic circuit 240 of FIG. 2 according to some embodiments. Row hammer logic circuit 240 includes generally a directed refresh management controller 300, a set of configuration registers 310, a direct-mapped activate counter 320, a hashed activate counter 330, and a mitigation counter 340. Directed refresh management controller 300 has a set of inputs for receiving programmable parameters related to directed refresh management, bidirectional connections to each of direct-mapped activate counter 320, hashed activate counter 330, and mitigation counter 340, a bidirectional connection to arbiter 238 of FIG. 2, and an output connected to an input of refresh logic 232 of FIG. 2.

Configuration registers 310 include a set of programmable registers including registers related to the directed refresh management operation. These registers include a directed refresh management activation rate register 311 labelled "DrfmActRate", a directed refresh management activation limit register 312 labelled "DrfmActLim", a directed refresh management command rate register 313 labelled "DrfmCmdRate", a directed refresh management command limit register 314 labelled "DrfmCmdLim". The function of these registers is for implementation of directed refresh management, which will be explained further below.

Direct-mapped activate counter 320 includes a set of m entries that in conjunction with directed refresh management controller 300 maintain counters that are directly mapped and indexed by their respective row addresses. Each entry includes a row address field and an activate count field. Shown in FIG. 3 are four representative entries, including entries storing row address fields labelled "$RA_0$", "$RA_1$", "$RA_2$", and "$RA_{m-1}$" and activation counts labelled "ACT COUNT$_0$", "ACT COUNT$_1$", "ACT COUNT$_2$", and "ACT COUNT$_{m-1}$", respectively.

Hashed activate counter 330 includes a set of n entries that in conjunction with directed refresh management controller 300 maintain counters that are indexed by a hash of their respective row addresses. Each entry includes a hashed row address field and a hashed activate count field. Shown in FIG. 3 are four representative entries, including entries storing hashed row address fields labelled "$HRA_0$", "$HRA_1$", "$HRA_2$", and "$HRA_{n-1}$" and hashed activation counts labelled "ACT COUNT$_0$", "ACT COUNT$_1$", "ACT COUNT$_2$", and "ACT COUNT$_{n-1}$", respectively.

Mitigation counter 340 includes a set of p entries that in conjunction with directed refresh management controller 300 maintain counters that are indexed by their respective row addresses. Each entry includes a hashed row address field of a row that has been recently mitigates, and a mitigation count field. Shown in FIG. 3 are four representative entries, including entries storing mitigation row address fields labelled "$RA_0$", "$RA_1$", "$RA_2$", and "$RA_{p-1}$" and mitigation counts labelled "DRFM COUNT$_0$", "DRFM COUNT$_1$", "DRFM COUNT$_2$", and "DRFM COUNT$_{p-1}$", respectively.

Row hammer logic circuit 240 handles directed refresh management as follows. Row hammer logic circuit 240 maintains counts of various row addresses that may need mitigation based on their activation counts. When memory controller 200 issues an activate command, directed refresh management controller 300 first searches direct-mapped activate counter 320 and hashed activate counter 330 for the presence of the row.

If an entry is found for the row, then directed refresh management controller 300 increments the corresponding activate count for the row. If no entry is found for the row, then directed refresh management controller 300 first searches direct-mapped activate counter 320 to see if there is an available entry. If there is an available entry, then directed refresh management controller 300 stores the row address in the corresponding RA field and sets the corresponding ACT COUNT field to 1 of the available entry. If there is no available entry, then directed refresh management controller 300 performs a hash of the row address, in which the row address is mapped to a particular location which corresponds to multiple possible row addresses, stores the row address in the corresponding RA field, and sets the corresponding ACT COUNT field to 1. The hashing function is selected to reduce the probability that multiple rows frequently accessed while running multiple program threads will be mapped to the same location. Hashed activate counter 330 must be able to form an activate counter for any row in the memory system. Because it is indexed directly by the row address, direct mapped activate counter 320 can be accessed faster than hashed activate counter 330, but hashed activate counter 330 can accommodate the full range of system addresses.

When memory controller 200 issues a mitigation command, directed refresh management controller 300 accesses mitigation counter 340 for the presence of the row. If an entry is found for the row, then directed refresh management controller 300 increments the corresponding mitigation count for the row. If no entry is found for the row, then directed refresh management controller 300 replaces a row corresponding to a hash of the row. Mitigation counter 340 accounts for the number of mitigation operations, which are also row hammer events requiring mitigation.

Directed refresh management controller 300 maintains the counts of each of direct-mapped activate counter 320, hashed activation counter 330, and mitigation counter 340. In some embodiments, it uses a "leaky-bucket" counter technique. A leaky-bucket counter operates as follows. When a new activation or mitigation event occurs, then directed refresh management controller 300 "fills" the bucket by incrementing the respective counter by one. Periodically and at a rate corresponding to the respective Rate field in configuration registers 310, directed refresh management controller 300 "empties" the bucket by decrementing the respective counter, such as by one or by some other amount. Directed refresh management controller 300 detects a row-hammer event requiring mitigation when the respective COUNT field exceeds the corresponding Limit register value over a certain time period. In other embodiments, directed refresh management controller 300 performs directed refresh management by randomly and periodically generating sample and mitigation commands.

In response to detecting a row-hammer event, directed refresh management controller 300 first signals arbiter 238 that the row is not available for access by asserting a signal labelled "!RowOK". The !RowOK signal causes arbiter 238 to issue a precharge command, either an explicit precharge command or a read or write command with the auto-precharge attribute set, any of which can indicate that the row address needs to be stored according to the DRFM technique. Directed refresh management controller 300 also sends a command to arbiter 238 to cause the corresponding memory to capture the row address internally during the command that causes the precharge. This operation allows the memory to identify the row as an aggressor row and to determine physically-adjacent rows for mitigation. Arbiter 238 allows these commands to be subject to arbitration rules that would, for example, pass normal reads and write but allow high-priority reads and writes to the same bank and urgent refreshes to occur before the aggressor row address capture and subsequent mitigation operations.

Afterward, directed refresh management controller 300 provides a mitigation request signal labelled "DRFM' to refresh logic 232. In response to a completion of the sample command and receiving the DRFM signal, refresh logic 232 provides the mitigation command to the bank containing the hammered row and prevents any other operation to that bank while the mitigation operation proceeds. Completion of the sample command occurs when the memory has finished storing the address of at least one adjacent row that is affected by the row hammer event so that the memory is ready to act upon the mitigation command. In some embodiments, memory controller 200 can be configured to support REF and REFM commands, REF, REFM, and DRFM commands, or REF and DRFM commands. In these embodiments, memory controller 200 prioritizes the different refresh commands between themselves and with activate commands to the same region. In one form, in response to detecting a row hammer event in a given region, the memory controller first determines whether a refresh command or a refresh management command is pending for the given region. If at least one of the refresh command and the refresh management command is pending for the given region, the memory controller issues each of the at least one of the refresh command and the refresh management command before issuing the DRFM command (e.g., by providing a sample command and subsequently a mitigation command to the memory) in response to the row hammer event. Furthermore, in this case, the memory controller prevents any activate commands from issuing to the given region before issuing the DRFM command. However, if no refresh command and no refresh management command are pending for the given region, the memory controller provides the DRFM command in response to the row hammer event.

Further details of how the memory processes the mitigation operations will now be explained.

Figure 4:
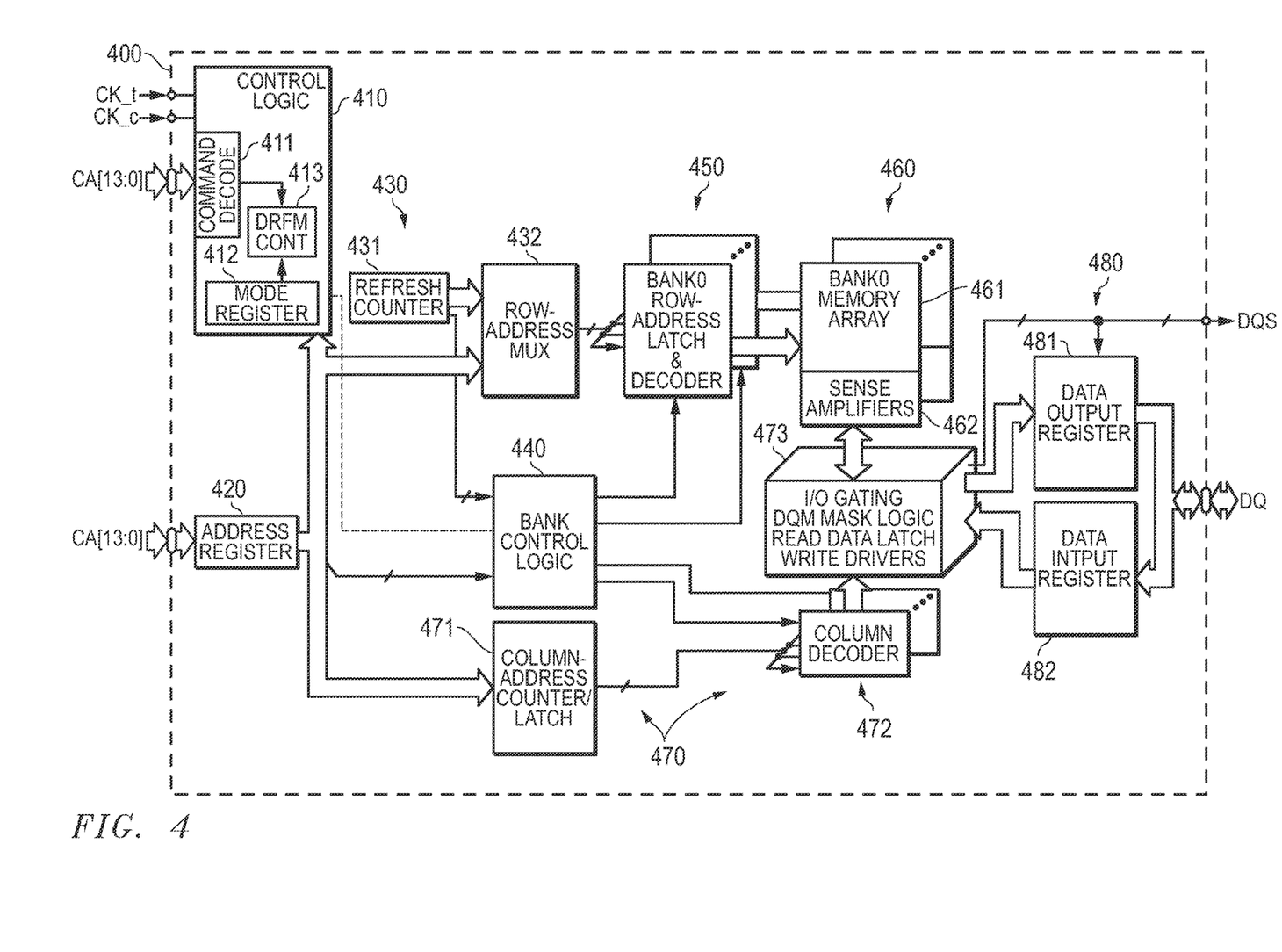
FIG. 4 illustrates in block diagram form an integrated circuit DRAM that in conjunction with the memory controller of FIG. 2 implements directed refresh management according to some embodiments.

FIG. 4 illustrates in block diagram form a DRAM 400 that in conjunction with memory controller 200 of FIG. 2 implements directed refresh management according to some embodiments. DRAM 400 in an integrated circuit DRAM and includes generally control logic 410, an address register 420, a row address circuit 430, a bank control logic circuit 440, a row address latch and decoder block 450, a memory array 460, a column access circuit 470, and a data input/output circuit 480.

Control logic circuit 410 has inputs for receiving true and complement clock signals labelled "CK_t" and "CK_c", respectively, a command and address input for receiving a set of command and address signals labelled "CA[13:0]", and various outputs not shown in FIG. 4. Control logic circuit 410 includes a command decoder 411, a mode register block 412, and a directed refresh management controller 413 labelled "DFRM CONT". Command decoder 411 has an input for receiving the CA[13:0] signals synchronously with the CK_t and CK_c signals, and output for providing a set of control signals for effectuating the received command. Mode register block 412 includes a set of various mode registers having programmable values that control the operation of DRAM 400, and an output for providing various mode register settings to other circuits in control logic 410. DFRM controller 413 has an input connected to the output of command decoder 411, a second input connected to the outputs of mode register block 412, and various outputs (not shown in FIG. 4) for responding to directed refresh management commands.

Address register 420 has a command and address input for receiving the command and address signals "CA[13:0]", a clock input (not shown in FIG. 4) for receiving the CK_t and CK_c signals, and an output for providing a latched address to various circuit blocks in DRAM 400.

Row address circuit 430 includes a refresh counter 431, and a row address multiplexer (MUX) 432. Refresh counter 431 has an output for providing a refresh address, and an output for providing a portion of the refresh address. Row address MUX 432 has an input connected to the output of refresh counter 431, and an output for a row address.

Bank control circuit 440 has a first input connected to the second output of refresh counter 431, a second input connected to control logic 410, a third input connected to the output of address register 420, and an output for providing a bank select signal.

Row address latch and decoder block 450 includes set of row latches and decoders for each bank. Each row address latch and decoder has an input connected to the output of row address mux 432, a second input connected to the output of bank control logic circuit 440, and an output for providing a set of decoded row select signals.

Memory array 460 includes a set of memory banks. In the example of DDR5, memory array 460 includes a set of thirty-two memory banks. However, in other embodiments, a different type of memory and a different number of memory banks may be used. Each memory bank has a memory array and a sense amplifiers circuit. As shown in FIG. 4, an exemplary memory bank forming Bank 0 includes a memory array 461 and sense amplifiers 462. Memory array 461 includes a set of rows crossing a set of columns in which memory cells are located at intersections of the rows and columns. Each row receives a corresponding one of the set of row addresses, and when activated, the row outputs a set of data values to sense amplifiers 462, or when precharged, receives a set of data values to be re-written to the memory cells along the selected row.

Column access circuit 470 includes a column address counter/latch 471, a column decoder 472, and an input/output (I/O) gating circuit 473. Column address counter/latch 471 has an input connected to the output of address register 420 for receiving a column address, and an output for providing a current column address. Column decoder 472 includes a set of column decoders for each bank and has an input connected to the output of column address counter/latch 471, a control input for receiving a decoded bank select signal, and an output for providing a set of column select signals. I/O gating circuit 473 has a set of gating circuits for each bank each having an output for providing read data, and an input for receiving write data.

Data input/output circuit 480 includes a data output register 481, and a data input register 482. Data output register 482 has a data input connected to the data output of the I/O gating circuit for each bank, and an output connected to a set of data I/O terminals generically labelled "DQ". Data input register 481 has an input connected to the data I/O terminals, and an output connected to the inputs of the I/O gating circuit for each of the banks.

DRAM 400 can be, for example, a DDR, version five (DDR5) memory. DDR5 memory includes thirty-two banks as well as certain features common to prior DDR memories and certain unique features. Command decoder 411 and mode register block 412 have been modified from known DDR memories to implement directed refresh management, and DRAM 400 also includes directed refresh management controller 413 in control logic 410.

A new mode register bit enables or disables the optional DRFM feature. When DRFM is enabled, there are two ways to capture the DRFM address. According to the first way, DRAM 400 precharges the selected bank and samples the DRFM address during the per-bank precharge cycle when a particular bit of the command is active. For example, CA[5]=0 indicates a DRFM capture, whereas CA[5]=1 indicates that CA[5] has its previously defined function. According to the second way, a write with auto-precharge (WRA), write pattern with auto-precharge (WRPA), or read with auto-precharge (RDA) causes DRAM 400 to perform the indicated function and sample the DRFM address during the indicated function when a particular bit of the command is active. For example, CA[9]=0 during the second command cycle of a WRA, WRPA, or RDA command indicates a DRFM capture after the auto-precharge, whereas CA[9]=1 does not cause sampling. Each bank has its own independent DRFM address register, which is updated with each DRFM sample such that it holds the last and most recent sample for the host-directed DRFM command.

DRAM 400 performs the DRFM operation as follows. It can perform the DRFM command for either all banks by modifying the refresh management all banks command (RFMab), or for the same bank by modifying the refresh management same bank (RFMsb) command. As with the precharge all banks (PREab) command, CA[5] becomes a control bit to select between normal refresh management when CA[5] is in a first state, e.g., 1, or directed refresh management when CA[5] is in a second state, e.g., 0. Executing the RFMab or RFMsb command with CA[5]=0 tells the DRAM to service the sampled DRFM address for all banks in which a DRFM address sample occurred. In this case, any banks without a DRFM address sample will use an address internally sampled by the DRAM.

It should be apparent that these commands and the particular bits used to signify the DRFM mode are somewhat arbitrary and that other suitable bits may be used.

Figure 5:
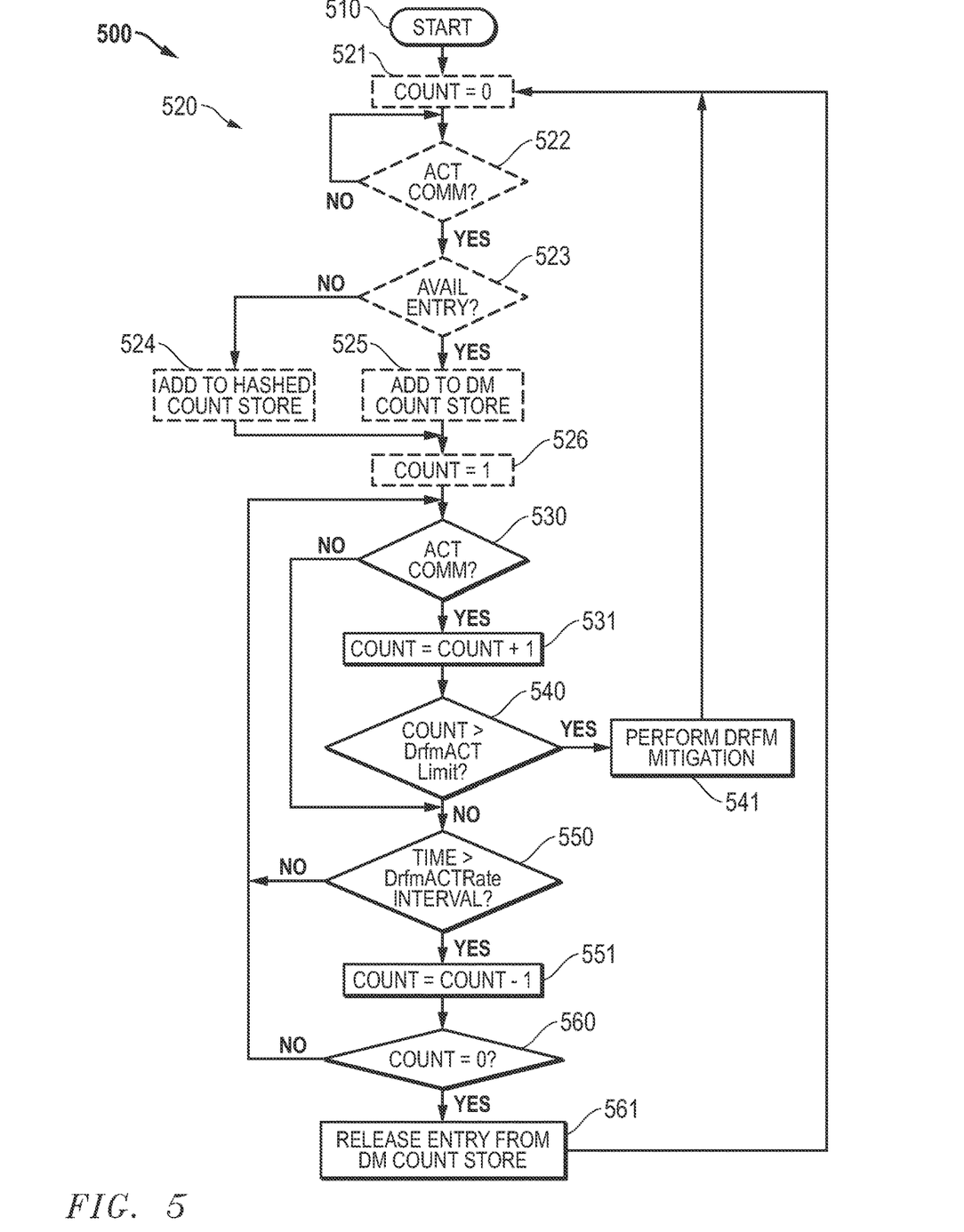
FIG. 5 illustrates a flow diagram of a process used with the row hammer logic circuit of FIG. 3 according to some embodiments.

FIG. 5 illustrates a flow diagram of a process 500 that row hammer logic circuit 240 of FIG. 3 uses to implement a leaky-bucket counter according to some embodiments. Process 500 start in box 510. A sub-flow 520 initializes the activate counter through an action box 521 that initializes the count to 0, and a decision box 522 that determines whether arbiter 238 selects an activate (ACT) command to dispatch to memory system 130. If not, then the process 500 repeats decision box 522 to continue to look for an ACT command. If so, then flow proceeds to a decision box 523 that determines whether there is an available entry in direct-mapped activate counter 320. If not, then in an action box 524 process 500 adds the access to hashed activate counter 330, but if so, then in action box 525 process 500 adds the address to direct mapped activate counter 320. In either case, in an action box 526, process 500 increments the count field to 1.

A decision box 530 determines whether row hammer logic circuit 240 detects that memory controller sends a subsequent ACT command to a row. If so, in an action box 531, process 500 increments the count by 1, and the in a decision box 540 determines whether the COUNT exceeds the DrfmActLimit value. If so, then flow proceeds to an action box 541, in which memory controller performs DRFM mitigation and then returns the flow to action box 521. If not, or if there is no ACT command received, then flow proceeds to decision box 550.

In decision box 550, process 500 determines whether the amount of elapsed time since the last emptying of the leaky-bucket counter exceeds the DrfmActRate interval. If not, then flow returns to decision box 530. If so, then flow proceeds to action box 551, which decrements the COUNT value by 1 to form the leak portion of the leaky-bucket counter. In a decision box 560, process 500 determines whether the leak has caused the COUNT to be equal to 0. If so, then if the entry is stored in direct-mapped activate counter 320, the entry is released from it. If not, then flow returns to decision box 530.

It should be apparent that process 500 is one possible implementation of the leaky-bucket structure that is efficiently done using a controller and registers with increments based on row activity and decrements based on elapsed time intervals. For use with a typical DDR5 memory system, the direct-mapped count store can have 512 buckets for each of 32 banks, thus requiring significant surface area. By using the hashed count store, the direct-mapped count store can have the most frequency used entries, while combining some addresses in the hashed count store, and therefore providing almost the same performance as if all row addresses were direct mapped, which saving a significant amount of chip area.

Memory controller 200 of FIG. 2 or row hammer logic circuit 240 of FIGS. 3 and 4 or any portions thereof, such as directed refresh management controller 300, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the internal architecture of memory channel controller 210 and/or power engine 250 may vary in different embodiments. Memory controller 200 may interface to other types of memory besides DDR5 DRAMs, such as future versions of high bandwidth memory (HBM), RAMbus DRAM (RDRAM), and the like as long as these memory chips have been modified to support the DRFM operations performed by the host memory controller. It may also interface to memory having different numbers of memory banks besides the example of 32. The sizes of the direct-mapped count store, the hashed address count store, and mitigation count store can vary and can be different from each other. Accordingly, it is intended by the appended claims to cover all modifications of the disclosed embodiments that fall within the scope of the disclosed embodiments.

What is claimed is:

1. A memory controller for generating accesses for a memory, comprising:
    a row hammer logic circuit for providing a sample request;
    wherein in response to the sample request, the memory controller generates a sample command for dispatch to the memory to cause the memory to capture a current row; and
    in response to a completion of the sample command, the memory controller generates a mitigation command for dispatch to the memory; and
    a leaky-bucket mitigation counter that increments a mitigation count value for a first row in response to the memory controller generating the mitigation command for the first row, decrements the mitigation count value periodically, and stalls an issuance of mitigation commands to the first row in response to the mitigation count value exceeding a mitigation count limit.

2. The memory controller of claim 1, wherein the row hammer logic circuit detects a row hammer event when a row activate count for the current row exceeds an activate limit.

3. The memory controller of claim 2, wherein the row hammer logic circuit determines the row activate count using a leaky-bucket activate counter, wherein:
    the leaky-bucket activate counter increments a count value for a first row in response to the memory controller generating an activate command for the first row, decrements the count value periodically, and determines a row hammer condition in response to the count value exceeding the activate limit.

4. The memory controller of claim 3, wherein:
    the leaky-bucket activate counter determines the row hammer condition further in response to the count value exceeding the activate limit for a predetermined period of time.

5. The memory controller of claim 3, wherein the leaky-bucket activate counter comprises:
    a direct-mapped activate counter for storing a row address and an activate count for a predetermined number of rows; and
    a hashed activate counter for storing the row address and the activate count for an additional number of rows.

6. The memory controller of claim 2, wherein:
    the row hammer logic circuit subsequently provides a mitigation request in response to detecting the row hammer event; and
    the memory controller further generates the mitigation command in response to the completion of the sample command and receiving the mitigation request to cause the memory to activate and then precharge the current row and at least one physically adjacent row.

7. The memory controller of claim 1, wherein the row hammer logic circuit provides the sample command during a row precharge period of the memory.

8. The memory controller of claim 1, wherein the row hammer logic circuit further schedules urgent refreshes before the mitigation command in response to receiving a mitigation request.

9. The memory controller of claim 1, wherein the row hammer logic circuit randomly and periodically generates the sample command and the mitigation command.

10. The memory controller of claim 1, wherein in response to detecting a row hammer event in a given region, the memory controller:
    determines whether a refresh command or a refresh management command is pending for the given region:
    if at least one of the refresh command and the refresh management command is pending for the given region, issues each of the at least one of the refresh command and the refresh management command before providing the sample request and the mitigation command in response to the row hammer event.

11. The memory controller of claim 10, wherein in response to detecting the row hammer event in the given region and determining that at least one of the refresh command and the refresh management command is pending for the given region, the memory controller:
    prevents any activate commands from issuing to the given region before providing the sample request and the mitigation command.

12. A data processing system, comprising:
a data processor comprising at least one memory accessing agent and a memory controller for generating accesses for a memory in response to memory access requests from the at least one memory accessing agent, the memory controller comprising:
a row hammer logic circuit for providing a sample request, wherein:
in response to the sample request, the memory controller generates a sample command for dispatch to the memory to cause the memory to capture a current row; and
in response to a completion of the sample command, the memory controller generates a mitigation command for dispatch to the memory; and
a leaky-bucket mitigation counter that increments a mitigation count value for a first row in response to the memory controller generating the mitigation command for the first row, decrements the mitigation count value periodically, and stalls an issuance of mitigation commands to the first row in response to the mitigation count value exceeding a mitigation count limit,
wherein the memory is coupled to the memory controller and is responsive to the sample command to store a current row, and is responsive to the mitigation command to activate and then precharge the current row and at least one physically adjacent row.

13. The data processing system of claim 12, wherein the row hammer logic circuit detects a row hammer event when a row activate count for the current row exceeds an activate limit.

14. The data processing system of claim 13, wherein the row hammer logic circuit determines the row activate count using a leaky-bucket activate counter for counting activates to the current row.

15. A method for directed refresh management (DRFM) for a memory, comprising:
detecting a row hammer event in a memory controller;
providing a sample request to the memory in response to detecting the row hammer event;
sampling a current row in the memory;
providing a mitigation command to the memory in response to providing the sample request, wherein providing the mitigation command comprises incrementing a mitigation count value for a first row in response to the memory controller generating the mitigation command for the first row, decrementing the mitigation count value periodically, and stalling an issuance of the mitigation command to the memory in response to the mitigation count value exceeding a mitigation count limit; and
mitigating the row hammer event by the memory.

16. The method of claim 15, wherein mitigating the row hammer event by the memory comprises:
activating and then precharging each of a sampled row and at least one physically adjacent row.

17. The method of claim 15, wherein detecting the row hammer event in the memory controller comprises determining the row hammer event using a leaky-bucket activate counter of the memory controller for counting activates to the current row, wherein the determining comprises:
incrementing an activate count for a first row of the leaky-bucket activate counter in response to the memory controller generating an activate command for the first row; and
decrementing the activate count periodically; and
determining the row hammer event in response to the activate count exceeding an activate limit.

18. The method of claim 15, further comprising:
providing the sample request during a row precharge period of the memory.

19. The method of claim 15, further comprising:
scheduling urgent refreshes before mitigating the row hammer event by the memory.

* * * * *